United States Patent [19]

Kosugi et al.

[11] 4,231,022

[45] Oct. 28, 1980

[54] INTERPOLATIVE PCM DECODER UTILIZED FOR $\mu$-LAW AND A-LAW

[75] Inventors: Hiroshi Kosugi, Yokohama; Hirofumi Inoue, Ichikawa; Hirotoshi Shirasu, Yokohama, all of Japan

[73] Assignee: Hitachi, Ltd., Japan

[21] Appl. No.: 969,841

[22] Filed: Dec. 15, 1978

[30] Foreign Application Priority Data

Jan. 6, 1978 [JP] Japan ................................ 53-215

[51] Int. Cl.³ .................................................. H03K 13/02
[52] U.S. Cl. ........................ 340/347 DA; 340/347 M; 370/109
[58] Field of Search .................. 340/347 M, 347 DA; 179/15 AV

[56] References Cited

U.S. PATENT DOCUMENTS

| | | | |
|---|---|---|---|
| 3,893,102 | 7/1975 | Candy | 340/347 M X |
| 3,987,436 | 10/1976 | Candy et al. | 340/347 M X |

OTHER PUBLICATIONS

Ritchie et al., "Interpolative Digital-to-Analog Converters," IEEE Transactions on Communications, Nov. 1974, pp. 1797-1806 (COM-22; No. 11).

Primary Examiner—Thomas J. Sloyan
Attorney, Agent, or Firm—Craig & Antonelli

[57] ABSTRACT

An interpolative PCM decoder converts PCM signals having polarity bits, segment selection bits and uniform quantization bits into an analog signal. The PCM decoder may be used both for $\mu$-law and A-law conversion by use of simple circuits and includes an AND gate circuit which produces a logical product between a selection signal for selecting a minimum unit of an analog value of a lower end of a segment and a control signal for change-over between the $\mu$-law and the A-law, and a circuit generating the same analog values as the minimum unit of the analog value in accordance with an output of the AND gate circuit.

3 Claims, 4 Drawing Figures

INTERPOLATIVE PCM DECODER UTILIZED FOR μ-LAW AND A-LAW

BACKGROUND OF THE INVENTION

1. Field of the Invention

This invention relates to interpolative PCM decoders, and more particularly to an interpolative PCM decoder which can be changed-over between A-law and μ-law uses.

2. Description of the Prior Art

An interpolative PCM decoder is described in detail in G. R. Ritchie et al; "Interpolative Digital to Analog Converters", IEEE, COM-22, 11, Nov. 1974.

The feature of this system resides in that all the quantization levels are not realized with a ladder circuit, but that only the ends of segments are realized with the ladder circuit, equally divided levels within the segments being realized by time-related averaging operations.

As will be stated in detail later, the interpolative PCM decoder disclosed in the above literature is for the μ-law. It cannot be used as an interpolative PCM decoder for the A-law, which needs to be constructed separately. Whether an interpolative PCM decoder is for the A-law or for the μ-law is decided, as will be stated later, depending on whether a logic circuit within the decoder is for the A-law or for the μ-law. Therefore, in order to use one interpolative PCM decoder for both the A-law and the μ-law, both a logic circuit for the μ-law and a logic circuit for the A-law must be included in the decoder, and approximately twice as many hardware elements as those for the μ-law use alone are required.

SUMMARY OF THE INVENTION

This invention has for its object to provide an interpolative PCM decoder which can be very simply changed-over between A-law and μ-law uses.

In order to accomplish the object, this invention makes improvements in an interpolative PCM decoder having holding means for holding a polarity bit signal, segment selection bit signals and uniform quantization bit signals for one sampling period, means for receiving the uniform quantization bit signals from the holding means and expanding the bit signals into a group of 1-bit signals on a time axis, means for adding the signals from the expansion means and the segment selection bit signals, a digital-to-analog (D/A) converter which generates an analog value of a lower end of each segment through selection of any of a group of switches contained therein, and a logic circuit for the μ-law which receives an output of the addition means and which generates a selection signal for the switch; and is characterized by additionally disposing therein an AND circuit which takes a logical product between a selection signal for selecting a minimum unit of the analog value of the lower end of the segment and a control signal for change-over between the μ-law and the A-law, a further switch which is selected by the output of the AND circuit, and means for generating the same analog value as the minimum unit of the first-mentioned analog value through the switch.

In this invention, the expression "means for expanding the uniform quantization bit signals into a group of 1-bit signals on a time axis" signifies means such as e.g. a binary rate multiplier wherein binary codes to a number corresponding to the magnitude of a bit signal composed of a plurality of bits are made "1" on a time axis, the other binary codes being made "0". That is, the means expands the uniform quantization bit signal into a 1-bit signal of "1" or "0" every subinterval within one sampling period.

DESCRIPTION OF THE PREFERRED EMBODIMENTS

Before the detailed description of an embodiment of this invention, a prior-art interpolative PCM decoder for the μ-law will be discussed with reference to FIG. 1. In the following description, a PCM code is assumed to be a signal of 8 bits.

Figure 1:
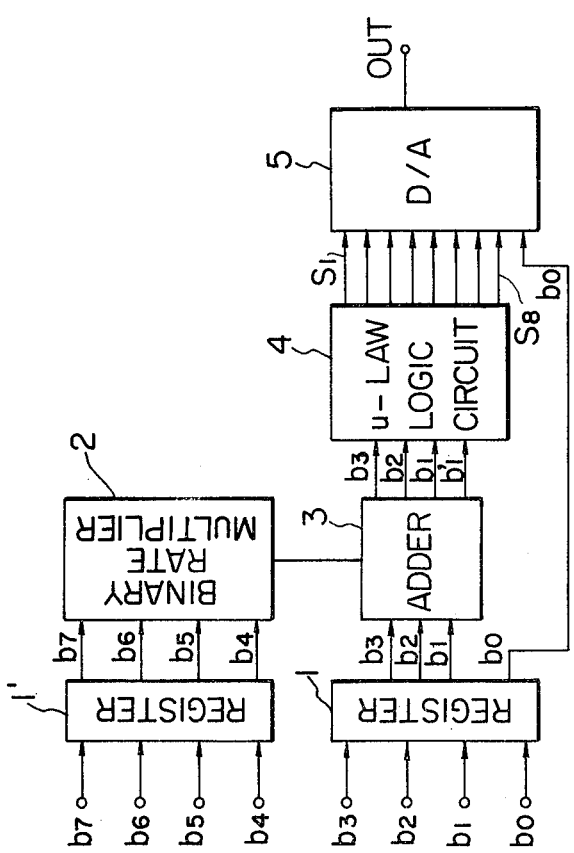
FIG. 1 is a diagram showing the schematic arrangement of an interpolative PCM decoder.

In FIG. 1, among bit signals $b_0$–$b_7$, the polarity bit signal $b_0$ and the segment selection bit signals $b_1$–$b_3$ are stored in a logic memory circuit 1 constructed of a register, and the uniform quantization bit signals $b_4$–$b_7$ are stored in a logic memory circuit 1' constructed of a register. The uniform quantization bit signals $b_4$–$b_7$ are entered into a binary rate multiplier (BRM) 2 which turns these signals into 1-bit signals expanded on a time axis. The segment selection bit signals $b_1$–$b_3$ of the logic memory circuit 1 and a carry signal being an output of the binary rate multiplier 2 are added in an adder 3. An output of the adder 3 is entered into a μ-law logic circuit 4 (the contents of which will be described in detail later). An output of the logic circuit 4 and the polarity bit signal $b_0$ are entered into a digital-to-analog (D/A) converter 5 which is composed of a ladder circuit (ladder resistor network), selector switches etc. Thus, decoded analog signals can be obtained.

In the μ-law of CCITT, the analog values of the lower ends of segments are determined to be 0, 1, 3, 7, 15, 31, 63 and 127 when the full scale is 255. The correspondence between these analog values and the segment selection bit signals $b_1$, $b_2$, $b_3$ is specified as given in Table 1.

TABLE 1

| $b_1$ | $b_2$ | $b_3$ | Analog value | $b_1$ | $b_2$ | $b_3$ | Analog value |
|---|---|---|---|---|---|---|---|
| 0 | 0 | 0 | 0 | 1 | 0 | 0 | 15 |
| 0 | 0 | 1 | 1 | 1 | 0 | 1 | 31 |
| 0 | 1 | 0 | 3 | 1 | 1 | 0 | 63 |
| 0 | 1 | 1 | 7 | 1 | 1 | 1 | 127 |

In the interpolative decoder, only the lower ends of the respective segments in Table 1 and "255" are realized with the ladder circuit. Moreover, it is operated at a speed which is 16 times higher than that of a non-interpolative decoder. Thus, a uniform quantization level of 1/16 in each segment is obtained by performing a time average concerning 1 sampling period.

Figure 2:
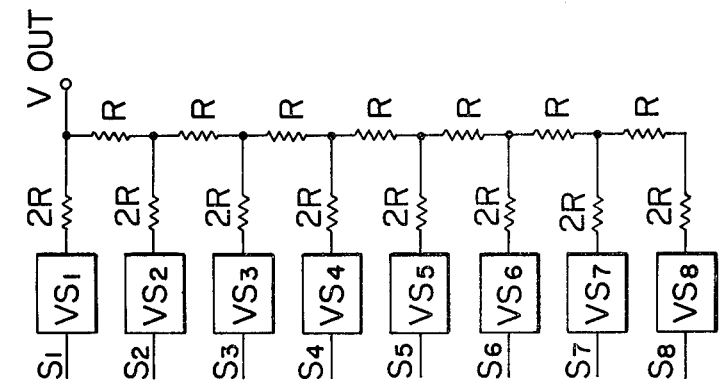
FIG. 2 is a diagram showing a detailed circuit of a part in FIG. 1, and FIGS. 3 and 4 are diagrams each showing the essential portions of an embodiment of this invention.

The ladder circuit in the D/A converter 5 is constructed as shown in FIG. 2. This ladder circuit is called the R-2R type. Ordinarily, R is termed the series resistance and 2R the parallel resistance. For the convenience of the explanation, it is supposed that the polarity bit signal $b_0$ is always "1". Voltage switches $VS_1$–$VS_8$ transmit a voltage of $+V_H$ (V) when drive signals $S_1-S_8$ of the corresponding logic signal ladder switches are "1", and transmit a voltage of 0 (V) when they are "0". Thus, $S_1-S_8$ have weights of $2^0, 2^1, \ldots$ and $2^7$ for an output voltage $V_{OUT}$ respectively.

The relationship between $b_1, b_2, b_3$ representative of the segment numbers in the PCM codes of the $\mu$-law and $S_1-S_8$ becomes as indicated in Table 2.

TABLE 2

| $b_1'$ | $b_1$ | $b_2$ | $b_3$ | $S_1$ | $S_2$ | $S_3$ | $S_4$ | $S_5$ | $S_6$ | $S_7$ | $S_8$ | Analog value |
|---|---|---|---|---|---|---|---|---|---|---|---|---|
| 1 | 0 | 0 | 0 | 1 | 1 | 1 | 1 | 1 | 1 | 1 | 1 | 255 |
| 0 | 1 | 1 | 1 | 0 | 1 | 1 | 1 | 1 | 1 | 1 | 1 | 127 |
| 0 | 1 | 1 | 0 | 0 | 0 | 1 | 1 | 1 | 1 | 1 | 1 | 63 |
| 0 | 1 | 0 | 1 | 0 | 0 | 0 | 1 | 1 | 1 | 1 | 1 | 31 |
| 0 | 1 | 0 | 0 | 0 | 0 | 0 | 0 | 1 | 1 | 1 | 1 | 15 |
| 0 | 0 | 1 | 1 | 0 | 0 | 0 | 0 | 0 | 1 | 1 | 1 | 7 |
| 0 | 0 | 1 | 0 | 0 | 0 | 0 | 0 | 0 | 0 | 1 | 1 | 3 |
| 0 | 0 | 0 | 1 | 0 | 0 | 0 | 0 | 0 | 0 | 0 | 1 | 1 |
| 0 | 0 | 0 | 0 | 0 | 0 | 0 | 0 | 0 | 0 | 0 | 0 | 0 |

Logic for converting the segment selection bit signals $b_1-b_3$ into the logic signals $S_1-S_8$ (which is called the logic $\mu$) is realized by the $\mu$-law logic circuit 4. In the output of the adder 3 (FIG. 1) and Table 2, $b_1'$ indicates a signal which is necessary for denoting the maximum value appearing when the signal from the BRM 2 is added to the segment selection bit signals $b_1, b_2, b_3$.

The inventor made studies for applying this interpolative PCM decoder to a case of the A-law stipulating another sort of PCM codes. According to the A-law, the lower ends of segments are specified as 0, 2, 4, 8, 16, 32, 64 and 128 with the full scale being 256. Therefore, a table prepared for the A-law similarly to Table 2 for the $\mu$-law becomes Table 3.

TABLE 3

| $b_1'$ | $b_1$ | $b_2$ | $b_3$ | $S_1'$ | $S_1$ | $S_2$ | $S_3$ | $S_4$ | $S_5$ | $S_6$ | $S_7$ | $S_8$ | Analog value |
|---|---|---|---|---|---|---|---|---|---|---|---|---|---|
| 1 | 0 | 0 | 0 | 1 | 0 | 0 | 0 | 0 | 0 | 0 | 0 | 0 | 256 |
| 0 | 1 | 1 | 1 | 0 | 1 | 0 | 0 | 0 | 0 | 0 | 0 | 0 | 128 |
| 0 | 1 | 1 | 0 | 0 | 0 | 1 | 0 | 0 | 0 | 0 | 0 | 0 | 64 |
| 0 | 1 | 0 | 1 | 0 | 0 | 0 | 1 | 0 | 0 | 0 | 0 | 0 | 32 |
| 0 | 1 | 0 | 0 | 0 | 0 | 0 | 0 | 1 | 0 | 0 | 0 | 0 | 16 |
| 0 | 0 | 1 | 1 | 0 | 0 | 0 | 0 | 0 | 1 | 0 | 0 | 0 | 8 |
| 0 | 0 | 1 | 0 | 0 | 0 | 0 | 0 | 0 | 0 | 1 | 0 | 0 | 4 |
| 0 | 0 | 0 | 1 | 0 | 0 | 0 | 0 | 0 | 0 | 0 | 1 | 0 | 2 |
| 0 | 0 | 0 | 0 | 0 | 0 | 0 | 0 | 0 | 0 | 0 | 0 | 0 | 0 |

That is, logic for converting the segment selection bit signals $b_1-b_3$ into $S_1'$ and $S_1-S_8$ and different from the case of the $\mu$-law (this shall be called the logic A) is required within the decoder. Therefore, in order to use a single decoder for both the $\mu$-law and the A-law, logic circuits of both the logic $\mu$ and the logic A must be included within the decoder.

Hereunder, this invention having solved the above problem will be described in detail.

Table 4 is for explaining the principle, and indicates the relationship among the segment selection bit signals in the 8 bits of the decoder input, the logic signals or drive signals $S_1-S_8$ of the ladder switches, and the ladder output values.

TABLE 4

| | | | | $\mu$-LAW | | | | | | | | | | A-LAW | | | | | | | |
|---|---|---|---|---|---|---|---|---|---|---|---|---|---|---|---|---|---|---|---|---|---|
| $b_1'$ | $b_1$ | $b_2$ | $b_3$ | $S_1$ | $S_2$ | $S_3$ | $S_4$ | $S_5$ | $S_6$ | $S_7$ | $S_8$ | $S_8'$ | Analog value | $S_1$ | $S_2$ | $S_3$ | $S_4$ | $S_5$ | $S_6$ | $S_7$ | $S_8$ | $S_8'$ | Analog value |
| 1 | 0 | 0 | 0 | 1 | 1 | 1 | 1 | 1 | 1 | 1 | 1 | 0 | 255 | 1 | 1 | 1 | 1 | 1 | 1 | 1 | 1 | 1 | 256 |
| 0 | 1 | 1 | 1 | 0 | 1 | 1 | 1 | 1 | 1 | 1 | 1 | 0 | 127 | 0 | 1 | 1 | 1 | 1 | 1 | 1 | 1 | 1 | 128 |
| 0 | 1 | 1 | 0 | 0 | 0 | 1 | 1 | 1 | 1 | 1 | 1 | 0 | 63 | 0 | 0 | 1 | 1 | 1 | 1 | 1 | 1 | 1 | 64 |
| 0 | 1 | 0 | 1 | 0 | 0 | 0 | 1 | 1 | 1 | 1 | 1 | 0 | 31 | 0 | 0 | 0 | 1 | 1 | 1 | 1 | 1 | 1 | 32 |
| 0 | 1 | 0 | 0 | 0 | 0 | 0 | 0 | 1 | 1 | 1 | 1 | 0 | 15 | 0 | 0 | 0 | 0 | 1 | 1 | 1 | 1 | 1 | 16 |
| 0 | 0 | 1 | 1 | 0 | 0 | 0 | 0 | 0 | 1 | 1 | 1 | 0 | 7 | 0 | 0 | 0 | 0 | 0 | 1 | 1 | 1 | 1 | 8 |
| 0 | 0 | 1 | 0 | 0 | 0 | 0 | 0 | 0 | 0 | 1 | 1 | 0 | 3 | 0 | 0 | 0 | 0 | 0 | 0 | 1 | 1 | 1 | 4 |
| 0 | 0 | 0 | 1 | 0 | 0 | 0 | 0 | 0 | 0 | 0 | 1 | 0 | 1 | 0 | 0 | 0 | 0 | 0 | 0 | 0 | 1 | 1 | 2 |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

In Table 4, $S_1$ has a weight of $2^7$, $S_2$ a weight of $2^6$, ..., $S_7$ a weight of $2^1$, and $S_8$ a weight of $2^0$. By endowing $S_8'$ with a weight of $2^0$ likewise to $S_8$, the analog values of the A-law become equal to the codes of the $\mu$-law with $S_8'=2^0$ added thereto. For example, when "$b_1'$ $b_1b_2b_3$" is "0011", "$S_1-S_8$" is "00000111" and its analog value is $2^2+2^1+2^0=7$ in the $\mu$-law. On the other hand, in the A-law, "$S_1-S_8$, $S_8'$" is "000001111" and its analog value becomes $2^2+2^1+2^0+2^0=8$. That is, it is proper to always make $S_8'$ "0" in case of the $\mu$-law and to make $S_8'=S_8$ in the A-law. $S_8$ can be said to be a selection signal for selecting the minimum unit of the analog value of the lower end of the segment. An understanding of this invention can be obtained referring to FIG. 3 and FIG. 4.

Figure 3:
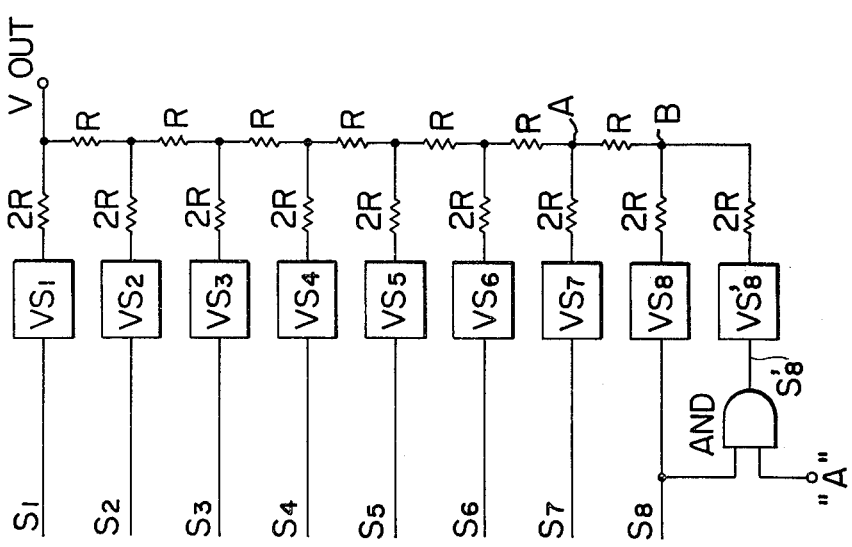

FIG. 3 is a diagram showing the essential portions of an embodiment of this invention.

In order to make the weight by $S_8'$ equal to the weight by $S_8$, a point A may be connected to a point B through a resistance R and the point B may be connected to the voltage switch $VS_8$ through the resistance 2R and similarly to a voltage switch $VS_8'$ through a resistance 2R as illustrated in FIG. 3. That is to say, the resistance 2R is connected in parallel with the parallel resistance corresponding to the minimum analog value, and the voltage switch $V_8'$ is connected to this resistance 2R. Thus the impedance viewed below from the point A becomes 2R and the impedance viewed towards the voltage switch $VS_7$ from the point A is also 2R, so that the total weight of $S_8$ and $S_8'$ and the weight of $S_7$ become equal. Both the impedances viewed towards the voltage switches $VS_8$ and $VS_8'$ from the point B are 2R, so that the weights of $S_8$ and $S_8'$ become equal and that the weight of each of $S_8$ and $S_8'$ becomes $\frac{1}{2}$ of the weight of $S_7$.

To establish $S_8'=0$ for the $\mu$-law and $S_8'=S_8$ for the A-law as indicated in Table 4 can be realized by employing an AND circuit AND and a control signal for change-over "A" as illustrated in FIG. 3. The control signal "A" is made "1" for the A-law and "0" for the $\mu$-law. Thus, an output $S_8'$ of the AND circuit AND becomes "0" for the $\mu$-law and equal to $S_8$ for the A-law.

In this way, it is unnecessary to employ logic circuits of both the logic $\mu$ and the logic A, and it suffices to use only the logic circuit for the logic $\mu$. The decoder becomes usable also for the A-law with its hardware remaining identical to that of the decoder for the μ-law only.

Figure 4:
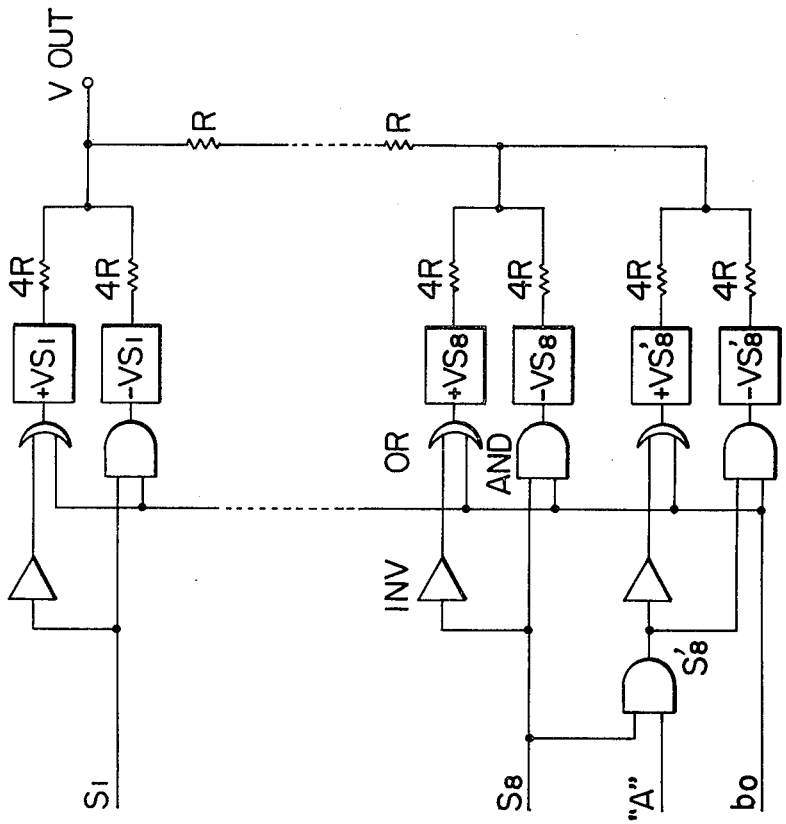

FIG. 4 is a diagram showing the essential portions of an embodiment in which the polarity bit signal $b_0$ is also taken into account.

In the figure, voltage switches $+VS_1$ to $+VS_8$, $+VS_8'$, $-VS_1$ to $-VS_8$ and $-VS_8'$ provide outputs $+V_H$ (V) when the logic signals are "1" and the polarity bit signal $b_0$ is "1", and they provide outputs $-V_H$ (V) when the logic signals are "1" and $b_0$ is "0". Consideration is now given to the problem of how an output voltage changes depending on the value of the polarity bit $b_0$ will be indicated as to the bit $S_8$. Assuming $S_8$ to be "1" and $b_0$ to be "1", both the voltage switches $+VS_8$ and $-VS_8$ provide $+V_H$ owing to an inverter (INV), an OR circuit (OR) and an AND circuit (AND), and assuming $S_8$ to be "1" and $b_0$ to be "0", both the voltage switches $+VS_8$ and $-VS_8$ provide $-V_H$. Therefore, $+V_H$ (V) and $-V_H$ (V) are respectively delivered as the output voltages through a resistance 2R. On the other hand, when $S_8$ is "0", the output voltages become 0 (V) irrespective of the values of $b_0$.

The operation above described is quite similar as regards $S_1-S_7$ and $S_8'$. With the present embodiment, the decoder can naturally be used for the A-law by disposing only the logic circuit for the logic μ. Although, in the foregoing two embodiments, the ladder circuits have been illustrated as being of the voltage drive type, it goes without saying that a ladder circuit of the current drive type may be employed.

We claim:

1. In an interpolative PCM decoder having holding means for holding a polarity bit signal, segment selection bit signals and uniform quantization bit signals for one sampling period, means for receiving uniform quantization bit signals from the holding means and expanding the bit signals into a group of 1-bit signals on a time axis, means for adding the signals from the expansion means and the segment selection bit signals, a digital-to-analog converter which generates an analog value of a lower end of each segment, and a logic circuit for the μ-law which receives an output of the addition means and which delivers a selection signal for generating the analog value to cause the output of the digital-to-analog converter to be switched from the lower boundary value of a given segment to the lower boundary value of the next higher segment as a function of time within one sampling period, said interpolative PCM decoder further comprising an AND circuit which receives the selection signal for selecting a minimum unit of the analog value of the lower end of the segment and a control signal for change-over between the μ-law and the A-law, and means for generating the same analog value as the minimum unit of the first-mentioned analog value in accordance with an output of said AND circuit.

2. An interpolative PCM decoder according to claim 1, wherein said expansion means is a binary rate multiplier.

3. An interpolative PCM decoder according to claim 1 or 2, wherein said digital-to-analog converter consists of a ladder circuit and a group of driving switches which are selected by the selection signals, and the generation means consists of a resistance which is connected in parallel with a parallel resistance corresponding to the minimum value of the analog values of said ladder circuit and a driving switch which is connected in series with the first-mentioned resistance.

* * * * *